United States Patent
Kooker et al.

(10) Patent No.: US 6,937,482 B2
(45) Date of Patent: Aug. 30, 2005

(54) COMPACT, HIGH EFFICIENCY, HIGH ISOLATION POWER AMPLIFIER

(75) Inventors: Robert W. Kooker, Freeland, MD (US); Paul E. White, York, PA (US); Thomas A. Bachman, II, Darlington, MD (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/733,564

(22) Filed: Dec. 11, 2003

(65) Prior Publication Data

US 2004/0120132 A1 Jun. 24, 2004

Related U.S. Application Data

(62) Division of application No. 10/085,200, filed on Feb. 26, 2002, now Pat. No. 6,760,230.
(60) Provisional application No. 60/272,013, filed on Feb. 28, 2001.

(51) Int. Cl.[7] .............................. H05K 9/00; H05K 7/14; H05K 7/18
(52) U.S. Cl. ....................... 361/818; 361/816; 361/800; 361/799; 361/753
(58) Field of Search ............................. 361/800, 799, 361/753, 816, 818, 728, 736, 748, 752, 760, 761, 758; 174/35 R, 35 GC, 255, 261, 262

(56) References Cited

U.S. PATENT DOCUMENTS

| | | |
|---|---|---|
| 3,783,420 A | 1/1974 | Bastian ........................ 334/39 |
| 4,590,617 A | 5/1986 | Kraemer ...................... 455/328 |
| 4,612,512 A * | 9/1986 | Powell et al. ................. 330/66 |
| 4,625,178 A | 11/1986 | Mannerstrom ............... 330/149 |
| 4,658,334 A | 4/1987 | McSparran et al. ......... 361/415 |

(Continued)

FOREIGN PATENT DOCUMENTS

| | | | |
|---|---|---|---|
| DE | 2916393 | 11/1980 | .......... H03F/3/189 |
| DE | 4118133 | 12/1992 | ............ H05K/9/00 |
| EP | 0986293 | 3/2000 | ............ H05K/9/00 |
| WO | WO8601969 | 3/1986 | ............ H05K/9/00 |
| WO | WO9720385 | 6/1997 | ............. H03F/3/68 |

OTHER PUBLICATIONS

*International Search Report*, PCT/US02/05939, Jul. 22, 2003.

Primary Examiner—Phuong T. Vu
(74) Attorney, Agent, or Firm—Wood, Herron & Evans, LLP

(57) ABSTRACT

A power feedforward amplifier uses integral cavities to provide RF isolation between subcircuits of the power amplifier. The chassis includes a main chassis body and a lid structure adapted to couple with the chassis body and define the subcircuit cavities. The inner lid includes an amplifier dividing wall and interstage walls adapted to isolate the main and error amplifier subcircuits of the feedforward power amplifier and further to isolate individual components of the subcircuits. In one embodiment, the amplifier subcircuits are mounted on a single circuit board and isolated from each other by the dividing wall. A delay line subcircuit portion is integral with the main chassis body and is coupled beneath the error amplifier subcircuit to contain and electromagnetically shield a delay line filter subcircuit while providing direct connection with the error amplifier.

9 Claims, 12 Drawing Sheets

U.S. PATENT DOCUMENTS

| | | | |
|---|---|---|---|
| 4,661,888 A | * | 4/1987 | Jewell et al. ............... 361/818 |
| 4,868,716 A | | 9/1989 | Taylor et al. .............. 361/424 |
| 4,872,090 A | | 10/1989 | Taylor et al. .............. 361/424 |
| 4,889,959 A | | 12/1989 | Taylor et al. ................ 174/35 |
| 5,107,404 A | | 4/1992 | Tam ........................... 361/424 |
| 5,250,845 A | | 10/1993 | Runyan ...................... 257/729 |
| 5,252,934 A | | 10/1993 | Myer .......................... 333/156 |
| 5,262,927 A | | 11/1993 | Chia et al. .................. 361/784 |
| 5,434,750 A | | 7/1995 | Rostoker et al. ............ 361/784 |
| 5,550,713 A | | 8/1996 | Pressler ...................... 381/818 |
| 5,566,055 A | | 10/1996 | Salvi, Jr. .................... 361/816 |
| 5,568,014 A | | 10/1996 | Aoki et al. .................. 315/3.5 |
| 5,587,920 A | | 12/1996 | Muyshondt et al. ........ 364/489 |
| 5,594,626 A | | 1/1997 | Rostoker et al. ............ 361/764 |
| 5,719,750 A | | 2/1998 | Iwane ......................... 361/784 |
| 5,729,183 A | | 3/1998 | Schuchmann et al. .......... 333/1 |
| 5,774,344 A | * | 6/1998 | Casebolt ..................... 361/800 |
| 5,790,383 A | | 8/1998 | Inagawa ..................... 361/760 |
| 5,808,529 A | | 9/1998 | Hamre ....................... 333/246 |
| 6,057,733 A | | 5/2000 | Donaldson et al. ......... 330/151 |
| 6,084,779 A | | 7/2000 | Fang .......................... 361/783 |
| 6,094,350 A | | 7/2000 | Achiriloaie ................. 361/737 |
| 6,531,918 B1 | * | 3/2003 | Posner et al. ............... 330/151 |

* cited by examiner

COMPACT, HIGH EFFICIENCY, HIGH ISOLATION POWER AMPLIFIER

RELATED APPLICATIONS

This application is a Divisional Application of U.S. application Ser. No. 10/085,200 filed Feb. 26, 2002 now U.S. Pat. No. 6,760,230, which in turn claims the filing benefit and priority of U.S. Provisional Application, entitled "Compact Low Cost High Isolation Amplifier Chassis and Method of Manufacturing the Same," Ser. No. 60/272,013, filed Feb. 28, 2001, each application of which is incorporated herein by reference in its entirety.

FIELD OF THE INVENTION

The present invention relates generally to power amplifiers and specifically to a compact, high efficiency, and high isolation power amplifier.

BACKGROUND OF THE INVENTION

Ideally, a radio frequency (RF) power amplifier would be perfectly linear, and thereby faithfully reproduce amplified RF signals. In practice, RF power amplifiers are generally non-linear and add a certain amount of unwanted distortion to the amplified signal. This distortion of the amplified signal is realized as one or more intermodulation distortion (IMD) products which are undesirable in the amplified output signal. Therefore, it is desirable to reduce or generally eliminate such IMD products and other error from the amplified signal.

Several techniques have been developed to reduce IMD products in amplified RF signals, such as, for example, feedforward amplification. One type of single-loop, feedforward power amplifier uses a main amplifier subcircuit, a delay line filter subcircuit, and an error amplifier subcircuit. In the operation of the feedforward amplifier, the main amplifier subcircuit amplifies an input carrier, thereby introducing non-linearity error in the form of IMD products. The delay line filter subcircuit receives the input carrier and the output carrier of the main amplifier subcircuit, including the introduced error. A carrier cancellation loop incorporated within the delay line subcircuit subtracts the input carrier from the main amplifier output carrier and error, so that only the error signal remains. The remaining error signal is then fed into the error amplifier subcircuit, where the error is amplified and inverted by an error amplifier subcircuit. The inverted error is then subsequently combined with the delayed output carrier and error from the main amplifier subcircuit. In that way, the inverted error signal cancels the error signal from the main amplifier subcircuit, generally leaving only the amplified output carrier remaining. Such feedforward power amplifiers are useful with a variety of RF transmission systems, including cellular telephone base stations and other communication systems requiring amplification with high linearity.

Existing designs for feedforward power amplifiers have various drawbacks. First, feedforward amplifiers are generally very inefficient from a power standpoint. For example, 5%–10% efficiency is typical. Such inefficiency is partially the result of the delay that must be introduced into various of the signals in the delay line subcircuit of the system. Such delays generally translate into heat and power losses. This is particularly true for the delay introduced in the high power output of the main amplifier. For example, to achieve proper error cancellation, delay of the output from the main amplifier subcircuit must coincide with the output and delay of the error amplifier subcircuit. The greater the delay introduced by the error amplifier subcircuit, the greater the delay (and resultant power loss/efficiency reduction) required for the output signal of the main amplifier subcircuit. Therefore, it is always desirable in such feedforward amplifiers to try to maximize efficiency by reducing introduced delays.

Existing amplifier designs are also complex in design, which increases their overall cost, not only from a material standpoint, but also from the manufacturing and assembly side, as well. For example, the various subcircuits comprising a feedforward RF amplifier must be electromagnetically isolated from each other for proper operation. That is, leakage paths which allow electromagnetic signals to propagate from one subcircuit to another must be minimized. Leakage paths may be typically minimized by surrounding each subcircuit in a Faraday shield type enclosure.

Several methods of maintaining the necessary isolation have been used in the past; however, such methods have resulted in expensive complexities. In some designs, subcircuits such as the main amplifier and error amplifier are provided in separate enclosed conductive chassis. Interconnects between the subcircuits are then provided with connectors, shielded cables, and filtered signal lines. This solution adds material and manufacturing complexities and costs, as well as unwanted size to the feedforward power amplifier. Because existing feedforward amplifier designs use several circuit boards and amplifier subcircuits, several chassis must be constructed and connected together.

Alternatively, cavities for the various circuit boards might be machined into a chassis, with the boards being dropped into the cavities. However, such a design further complicates the interconnections between the components of the system and between the boards.

Another isolation technique employed is the use of separate bolt-on or soldered internal shielding walls. However, such methods for achieving isolation involve additional components, more assembly steps, and therefore higher production costs. Still further, separate metal boxes or cans may be used to separate the subcircuits, which are then bolted into other, larger boxes. As may be appreciated, such a design further adds to the complexity of the design with resulting increased material and production costs. Further, these methods still do not always provide the level of isolation desired for feedforward amplifiers.

Furthermore, while it is desirable to also shield the delay line subcircuit from the other components of a feedforward power amplifier, it is an additional goal to position the delay line subcircuit so as to minimize the length of connections between the delay line subcircuit and the other circuit components, thereby reducing output losses within the amplifier, and increasing overall efficiency.

Therefore, there is a need in the art to reduce the complexity, size, and overall cost of a feedforward amplifier design while still achieving desired efficiency and isolation characteristics in its operation. More specifically, there exists a need for a feedforward power amplifier design that provides the necessary isolation between subcircuits of the power amplifier, maintains subcircuits of the power amplifier in desirable position with respect to one another, and provides desired efficiency. Such goals are preferably accomplished in a design having a low material cost, a simple, low cost assembly process, and a small size.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF EMBODIMENTS OF THE INVENTION

For better understanding of the context of the disclosed embodiments of the present invention, a description of one suitable feedforward amplifier design is useful, and is set forth herein for illustrative purposes. A person of ordinary skill in the art will recognize other designs as also being suitable for practicing the invention.

Figure 1:
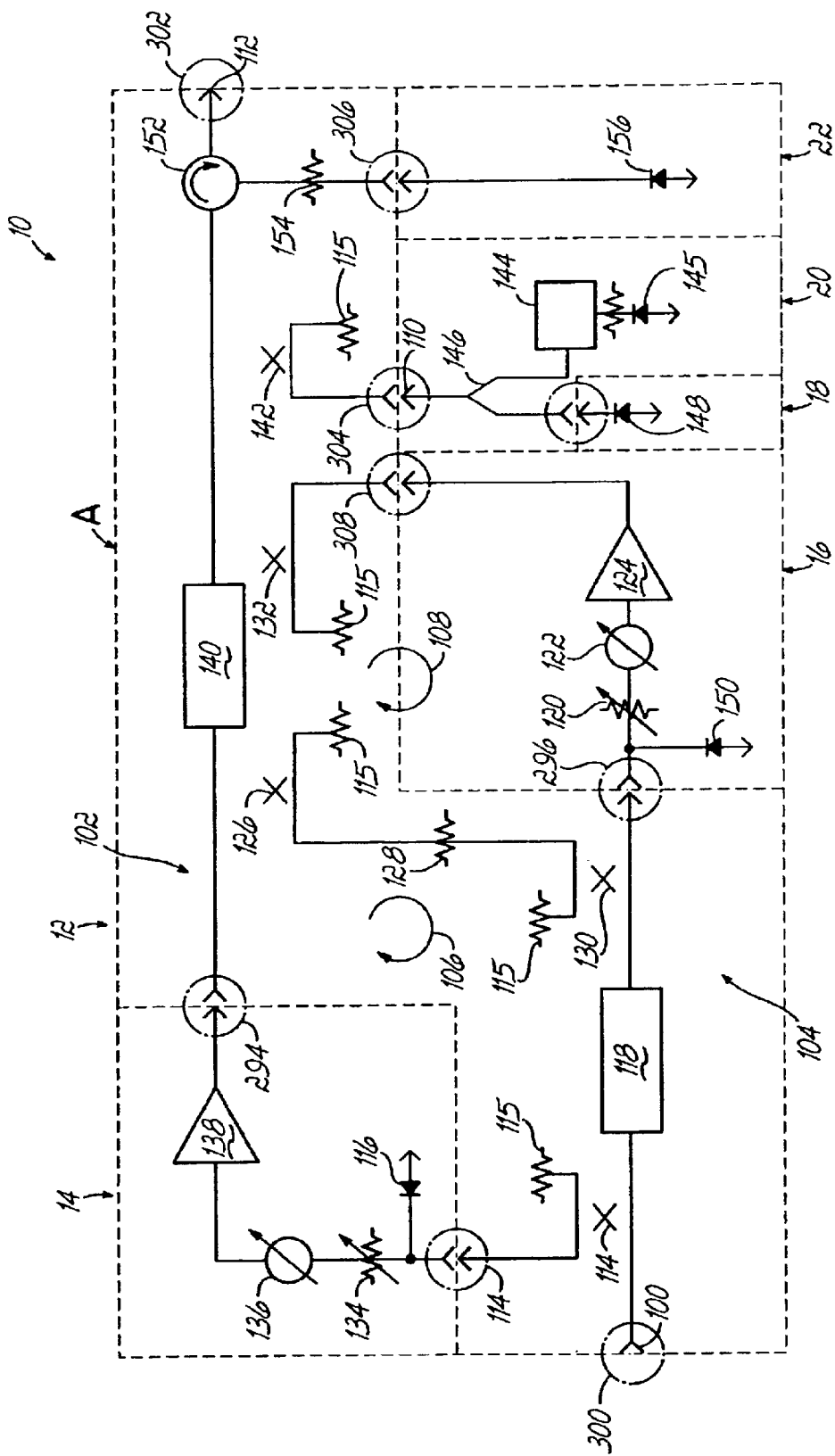
FIG. 1 is a schematic circuit diagram showing various subcircuits of a feedforward power amplifier in one embodiment of the present invention.

FIG. 1 shows a circuit block diagram of one type of feedforward power amplifier 10 suitable for use in one embodiment of the present invention. Dotted lines, "A" in FIG. 1, are used to show separation between various subcircuits which are to be electromagnetically isolated via a design and chassis according to an embodiment of the present invention. Subcircuits shown in FIG. 1 generally include a delay line subcircuit 12, a main amplifier subcircuit 14, an error amplifier subcircuit 16, a forward power detector subcircuit 18, a scanning receiver subcircuit 20, and a reverse power detector subcircuit 22. The circuitry and operation of the power amplifier 10 and various of the subcircuits is described herein, though it is understood by a person of ordinary skill in the art that the present invention may be Used with linear power amplifiers having more, or fewer, or different subcircuits than those shown in FIG. 1. For example, separate subcircuits as described may be combined into larger subcircuits, or new subcircuits offering different functionality may be used. Additionally, the present invention may be used with feedforward amplifiers employing secondary error cancellation loops, or any other type of amplifier using one or more delay lines to improve linearity.

The feedforward power amplifier 10 (which may be a multi-carrier amplifier) includes an input 100, a main signal path 102, a feedforward path 104, and an output 112. The power amplifier 10 further includes a carrier cancellation loop (CCL) 106, an error correction loop (ECL) 108, and a scanning receiver 144. On the feedforward path 104, which progresses through several subcircuits, there is provided a feedforward delay filter 118, a feedforward variable attenuator 120, a feedforward phase shifter 122, and an error amplifier 124. On the main signal path 102, also progressing through the subcircuits, there is provided a main variable attenuator 134, a main phase shifter 136, a main amplifier 138, and a main delay filter 140.

The input 100 receives radio frequency (RF) carrier signals, and an input carrier coupler 114 couples the RF carrier signals onto both the main signal path 102 and the feedforward path 104. Alternatively, a splitter (not shown) may be used to provide the RF carrier signals onto the main signal path 102 and the feedforward path 104.

Referring still to FIG. 1, the RF carrier signals on the main signal path 102 may be attenuated by the main variable attenuator 134 and phase shifted by the main phase shifter 136, although not necessarily in that order. A CCL (106) power detector 150, shown located in the error amplifier subcircuit 16, may be provided on the feedforward path 104 to monitor the power level of the signals after the carrier signals have been subtracted in the CCL 106. Control of the main variable attenuator 134 and the main phase shifter 136 may be under microprocessor control or any other suitable interface capable of monitoring the CCL power detector 150 and adjusting the main variable attenuator 134 and the main phase shifter 136 in accordance with the output of the CCL power detector 150. As with other power detectors in the feedforward power amplifier circuit, the output of an input power detector 116 is directed to a microprocessor (not shown), which may be contained in the monitor and control board 208, shown in FIG. 9. The voltage from the CCL power detector 150 is used to adjust the main variable attenuator 134 and the main phase shifter 136 to obtain maximum carrier cancellation out of the CCL 106. The microprocessor may or may not utilize the signal from the input power detector 116 when determining adjustments for maximal carrier cancellation.

The input power detector 116 may be provided on the main signal path 102 to monitor the input power levels. For example, if the power level of a carrier signal is above or below a desired threshold, the voltage output of the input power detector 116 may be used to trigger an error condition, such as a reset or power down.

After the RF carrier signals have been attenuated and phase shifted on path 102, they are amplified by the main amplifier 138. The main amplifier 138 produces or outputs, in addition to the desired amplified RF carrier signals, unwanted IMD products. The IMD products or error are caused by inherent non-linearities within the main amplifier 138. If the RF carriers, for example, lie in several frequency bands, or designated channels, the IMD products from one frequency band may spill over into other adjacent or nearby frequency bands or channels. This effect becomes more pronounced the closer the main amplifier 138 is driven to saturation.

Next, the amplified RF carrier signals and IMD products from the output of amplifier 138 are time delayed by the main delay filter 140 to produce delayed amplified RF carrier signals and delayed amplified IMD products on the main signal path 102. The time delay is chosen such that the amplified RF carrier signals and associated IMD products appear on the main signal path 102 at substantially the same time that the adjusted carrier signals and IMD products from an error amplifier 124 are coupled onto the main signal path 102. Since any delay introduced in the signals input and output from the error amplifier circuit and associated with the error signals requires corresponding delays and power loss from the delay filter 140, the present invention, as discussed further below, minimizes delays in the input and output between the error amplifier subcircuit and the delay line.

Meanwhile, on the feedforward path 104, a feedforward delay filter 118 delays the RF carrier signals such that the RF carrier signals appear on the feedforward path 104 at substantially the same time the attenuated sample of the amplified RF carrier signals (and associated IMD products) are coupled onto the feedforward path 104 by a feedforward CCL coupler 130. The carrier cancellation loop (CCL) 106 couples the amplified RF carrier signals and associated IMD products on the main signal path 102 onto the feedforward path 104 at the output of the feedforward delay filter 118.

The CCL 106 includes (1) a main CCL coupler 126 which couples the amplified RF carrier signals and associated IMD products from the main signal path 102 onto the CCL 106, (2) a CCL attenuator 128 for attenuating the amplitude of the coupled signals, and (3) a feedforward CCL coupler 130 which couples the amplified (and subsequently attenuated) RF carrier signals and associated IMD products onto the feedforward path 104 at the output of the feedforward delay filter 118. The phase of the amplified RF carrier signals in the CCL 106 should be inverted (out of phase) with respect to the phase of the delayed RF carrier signals on the feedforward path 104 after the feedforward delay filter 118.

The CCL attenuator 128 attenuates the coupled signals such that the amplitude of the amplified RF carrier signals is substantially equal to the amplitude of the delayed RF carrier signals on the feedforward path 104, in order to obtain maximum carrier cancellation. Attenuation resulting from the main CCL coupler 126 and the feedforward CCL coupler 130, as well as the gain of the main amplifier 138, in addition to the coupling factor of the input carrier coupler 114, and the insertion loss of the feedforward delay filter 118 are taken into consideration when selecting the attenuation factor for the CCL attenuator 128. The CCL attenuator 128 produces attenuated RF carrier signals and attenuated IMD products.

After coupling by the feedforward CCL coupler 130, the two out-of-phase carrier signals cancel each other so that primarily the isolated IMD products are fed into the error amplifier subcircuit 16, though insignificant levels of carrier products may also be present. In the error amplifier subcircuit 16, these isolated IMD products are amplified and phase inverted (with respect to the amplified IMD products at the output of the main amplifier 138), so that the two signals will cancel each other when combined at the main ECL coupler 132.

Figure 9:
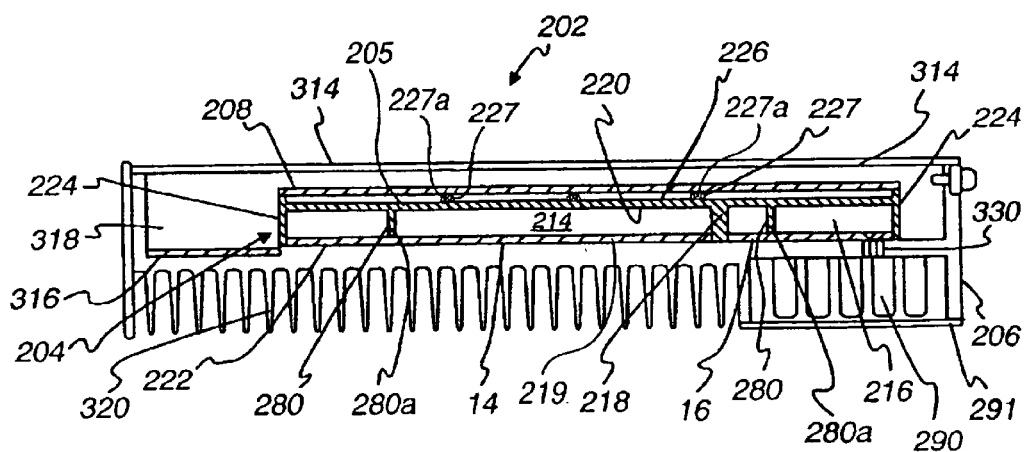
FIG. 9 is a cross-sectional view of a power amplifier according to one embodiment of the present invention.

The isolated IMD products are presented to the feedforward attenuator 120, the feedforward phase shifter 122, and the error amplifier 124. The amplitude of the isolated IMD products may be attenuated by the feedforward attenuator 120, and the phase of the isolated IMD products may be shifted by the feedforward phase shifter 122, though not necessarily in that order. The feedforward attenuator 120 and feedforward phase shifter 122 are under the control of a suitable monitor and control board 208 as shown in FIG. 9. Signal and power lines are passed through EMI filters to the monitor and control board 208. Examples of the signal lines include detector output, variable attenuator and phase shifter control lines, and bias monitor and control lines. The monitor and control board 208 is one type of printed circuit board which can be used with one embodiment of the present invention in the position shown in FIG. 9.

The attenuated and phase-shifted IMD products are amplified by error amplifier 124. The gain of the error amplifier 124 is selected such that the IMD products cancel at the main ECL coupler 132, resulting in substantial reduction of IMD products at the output 112. The error amplifier 124 is operated well below saturation to avoid creating non-linear distortion products of its own in the error correction loop 108.

The error amplifier 124 produces amplified IMD products whose phase is inverted with respect to the phase of the delayed amplified IMD products on the main signal path 102. The amplitudes of the amplified IMD products and the delayed amplified IMD products are substantially identical. Because they are also phase inverted, when the amplified products are coupled by a main ECL coupler 132 onto the main signal path 102, the amplified IMD products and the delayed amplified IMD products substantially cancel each other so that IMD products are essentially eliminated from the main signal supplied to the output 112.

The resultant amplified RF carrier signals are coupled onto a scanning receiver 144 by a scanning receiver coupler 142. Optionally, a splitter 146 may provide the amplified RF carrier signals to both the scanning receiver 144 and to an output power detector 148. The scanning receiver 144 produces an output voltage corresponding to the signal level in the channel of interest. This signal is routed to an A/D converter for use by the microprocessor on the monitor and control board 208 (shown in FIG. 9). The output power detector 148 converts the amplified RF carrier signals to a voltage representative of their power. In one aspect of the present invention, the output power detector 148 monitors the output power of the main amplifier 138 for abnormalities, such as triggering a fault alarm when, for example, too much power is detected. One suitable scanning receiver is discussed in copending U.S. Patent Application entitled "A Scanning Receiver for Use in a Feed-Forward Multi-Carrier Power Amplifier," and filed on Mar. 6, 2001, which is incorporated herein by reference in its entirety.

The feedforward power amplifier circuit 10 may include a circulator 152 with an associated circulator attenuator 154. The circulator 152 serves to prevent the flow of reflected RF power from the output 112. An output line from the circulator 152 is connected to a reverse output power detector 156, and signal from the reverse output power detector 156 is fed, for example, into a monitor and control board 208 for detection. RF power entering the circulator 152 subsequently leaves the circulator along the next pathway crossed by the clockwise arrow. Thus, reflected RF power from the output 112 exits toward the reverse output power detector 156 rather than toward the other circuit components, which might be damaged by reflected power.

As discussed above, the feedforward power amplifier circuit 10 is divided into several subcircuits to be electrically isolated from one another. In accordance with one aspect of the invention, the amplifier chassis design provides a unique isolation scheme in a compact, non-complex, and low cost (manufacturing and material) package. Subcircuits may be grouped into component groups, or smaller subcircuits within the larger subcircuits of the present invention. In accordance with an aspect of the invention, the main amplifier subcircuit and the error amplifier subcircuit are positioned on a single circuit board. In one embodiment of the present invention, the delay line filter subcircuit 12 includes the following components: the input carrier coupler 114, the feedforward delay filter 118, the feedforward CCL coupler 130, associated terminations 115, the CCL attenuator 128, the main CCL coupler 126, the main delay filter 140, the main ECL coupler 132, the scanning receiver coupler 142, the circulator 152, and the circulator attenuator 154.

As discussed further hereinbelow, various different delay line subcircuits and associated component layouts and filter designs might be utilized in practicing the invention. For example, suitable delay line subcircuits and filter designs are available from companies such as Andrew Corporation of Orland Park, Ill., Filtronic Comtek Ltd. of West Yorkshire, U.K. or Remec, Inc. of San Diego, Calif. The present invention, in accordance with various of its aspects, also utilizes a uniquely positioned and interfaced error amplifier and delay line subcircuit wherein the delay line subcircuit, regardless of its specific design, is machined or cast into a chassis of the amplifier. The error amplifier is positioned generally directly thereabove and is coupled generally directly to the delay line subcircuit with minimal delay introduced at the interface between the two circuits. Further details are set forth below.

In the design disclosed herein, the main amplifier subcircuit 14 includes the following components or subcircuits: the input power detector 116, the main variable attenuator 134, the main phase shifter 136, and the main amplifier 138.

The error amplifier subcircuit 16 includes the optional CCL power detector 150, the feedforward attenuator 120, the feedforward phase shifter 122, and the error amplifier 124.

The forward power detector subcircuit 18 includes the output power detector 148.

The scanning receiver subcircuit 20 includes the optional splitter 146, the scanning receiver 144, and a scanning receiver power detector 145.

Finally, the reverse power detector subcircuit 22 includes the reverse output power detector 156.

The subcircuits are connected via appropriate connectors as shown in FIG. 1 by connector arrows, "-->>--". In accordance with one aspect of the invention, connections between the error amplifier subcircuit 16 and the delay line subcircuit 12 is accomplished by a direct coax connector which is soldered or otherwise coupled at one end to the circuit board with the error amplifier thereon, and is press-fit through a hole in the chassis to make a direct connection to the delay line subcircuit. The various subcircuits may be connected via direct connections utilizing blind-mate coaxial connectors, or the connections may be made using connectorized coaxial cables. The dotted lines, "A" of FIG. 1, are used to demarcate subcircuit boundaries where RF-isolating walls, according to another aspect of the present invention, are preferably located. It is to be understood that the features of the present invention may be customized to fit a variety of alternative amplifier designs and constructions. For example, though a single loop feedforward power amplifier is discussed in connection with the present invention, the principles of the present invention may also be applied to double loop feedforward power amplifiers or any other type of amplifier utilizing one or more delay lines to improve linearity.

Turning now to FIGS. 2–11, perspective and cutaway views of portions of a feedforward power amplifier embodiment according to the principles of the present invention are shown. The present invention uses a unique combination of a chassis body and lid structure design for achieving various aspects of the invention, such as reduced complexity, simpler and more cost effective construction, and desirable isolation and efficiency.

The chassis 202 of the present invention may be manufactured of a variety of materials and in a variety of sizes. In one embodiment, aluminum is used for the complete chassis and aluminum is particularly preferred for its ability to conduct heat in the main chassis body 206. Aluminum alloys may also be used. In one embodiment, zinc is used for shielding in the inner lid 204. Though the chassis, according to one embodiment of the present invention, is cast out of aluminum or aluminum alloys, it is to be understood that the chassis and components, according to the present invention, may be formed by other methods, including machining of metals, casting of metallized plastic, and casting plastic with surface metallization applied later.

Referring to FIG. 9, chassis 202 comprises a lid structure or lid designated as an inner lid 204 and a main chassis body 206 covered by an outer lid 314 to close the chassis. The term "lid" is used herein to designate a structure which covers a portion of the subcircuits for isolation, and such term is not meant to be limiting with respect to how the structure interfaces with chassis body 206. The main chassis body 206 includes a delay line subcircuit portion 290 formed therein (see FIGS. 10 and 11) for housing the delay line subcircuit 12. The bottom side 220 of the inner lid 204 is configured to include, among other cavities, a main amplifier cavity 214 which houses and isolates the main amplifier subcircuit 14 and an error amplifier cavity 216 which houses and isolates the error amplifier subcircuit 16. These cavities and subcircuits are visible in FIG. 9, which shows a cross-sectional side view of the chassis 202.

In accordance with one aspect of the present invention, the unique inner lid 204 is configured to isolate various subcircuits, both above and below the main plane of the inner lid. In one embodiment of the invention, those various subcircuits might be on individual boards which are thereby individually isolated. For example, one embodiment described herein utilizes separate main amplifier and error amplifier boards. However, in one particularly desirable embodiment, and in accordance with one aspect of the present invention, both the main amplifier subcircuit and error amplifier subcircuit and related components are configured on a single circuit board. Such a configuration is desirable for reducing the complexity of the overall amplifier design and thereby reducing material and production costs. Utilization of the main amplifier subcircuit and error amplifier subcircuit on a single circuit board is possible due to the unique configuration of the chassis 202 of the present invention, and particularly the unique configuration of the inner lid 204, which affords high levels of isolation between the main amplifier and the error amplifier.

Figure 3:
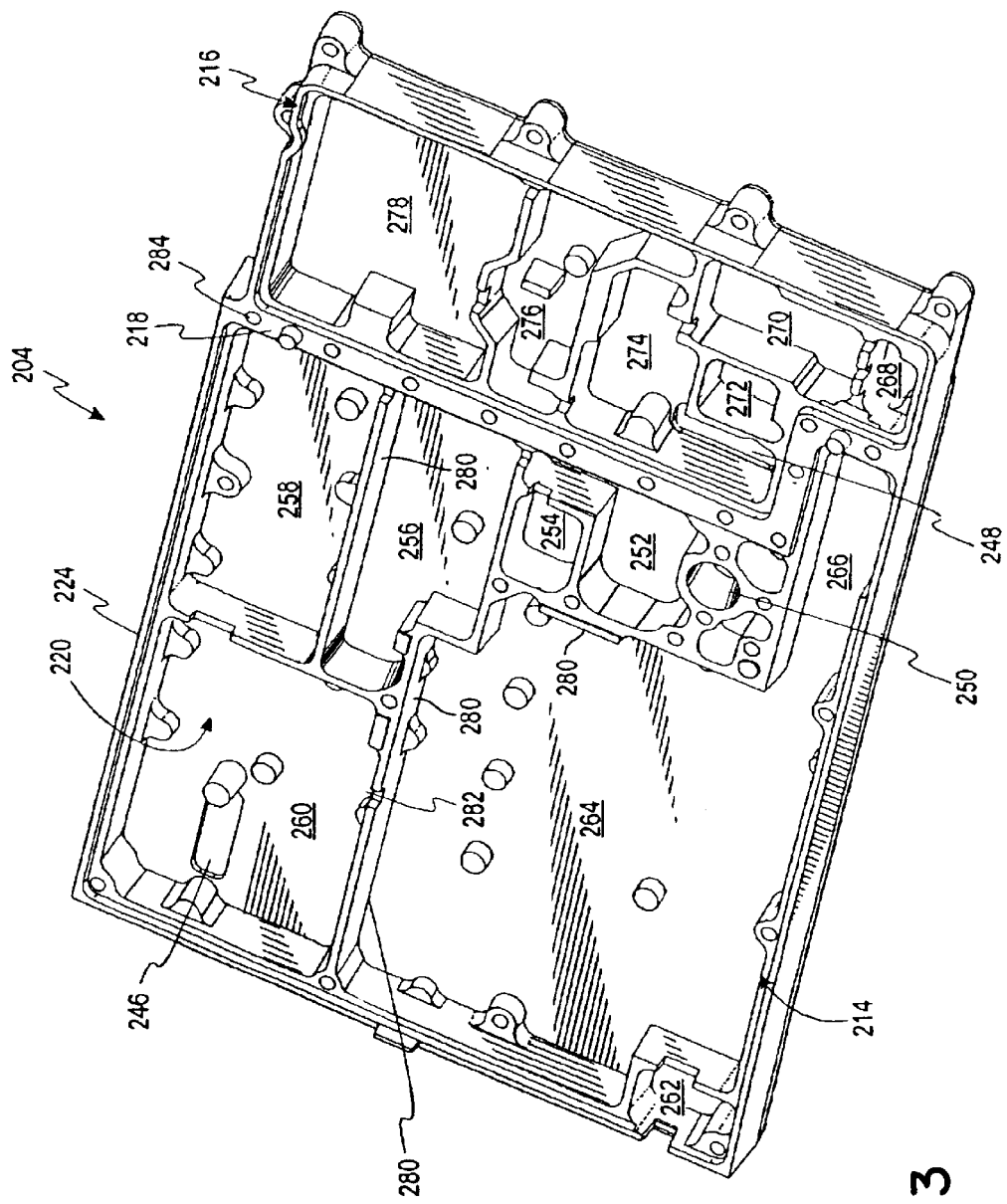
FIG. 3 is a perspective view of a bottom side of an inner lid structure according to one embodiment of the present invention.
Figure 3A:
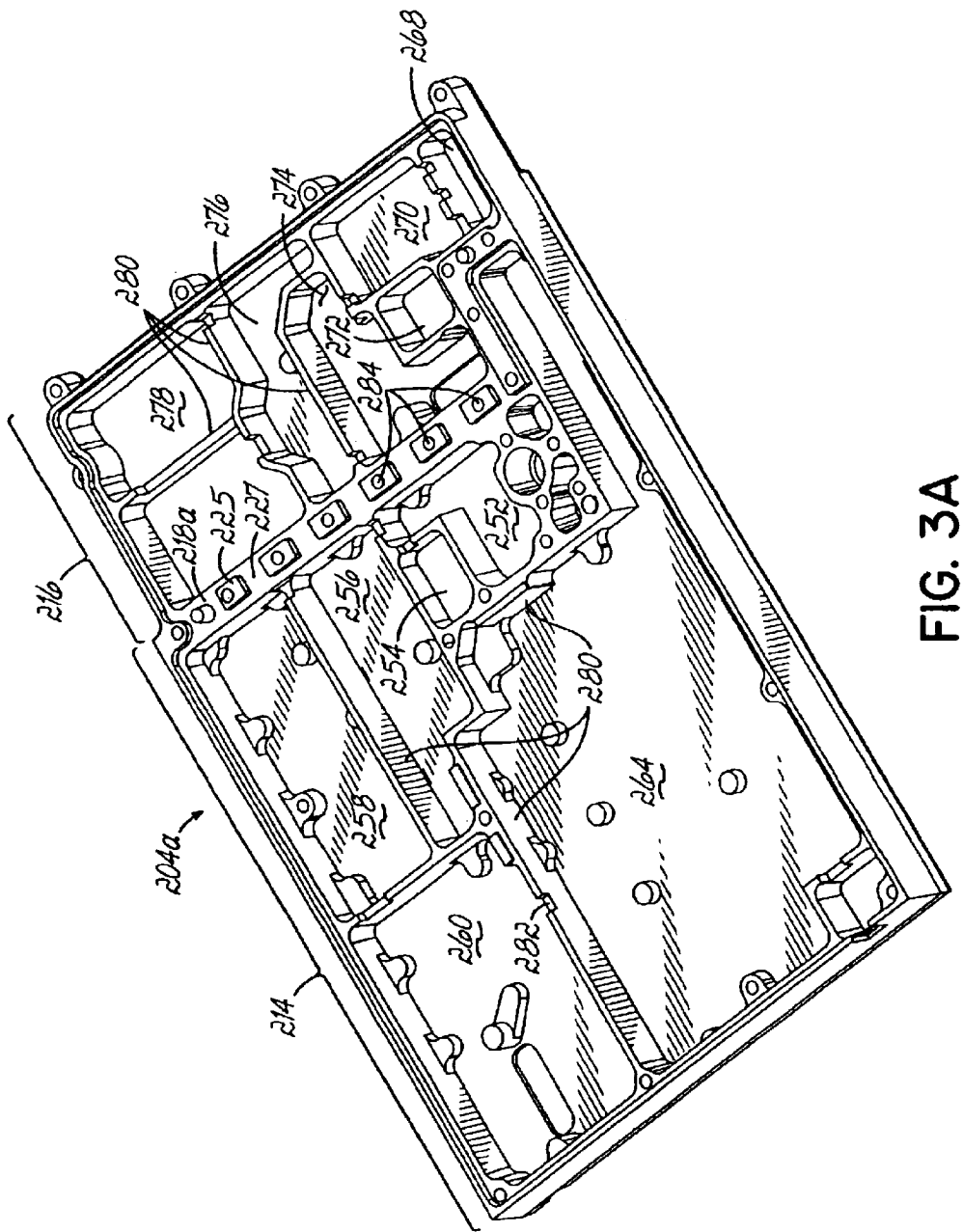
FIG. 3A is a perspective view of a bottom side of an inner lid structure in accordance with another embodiment of the invention.
Figure 3B:
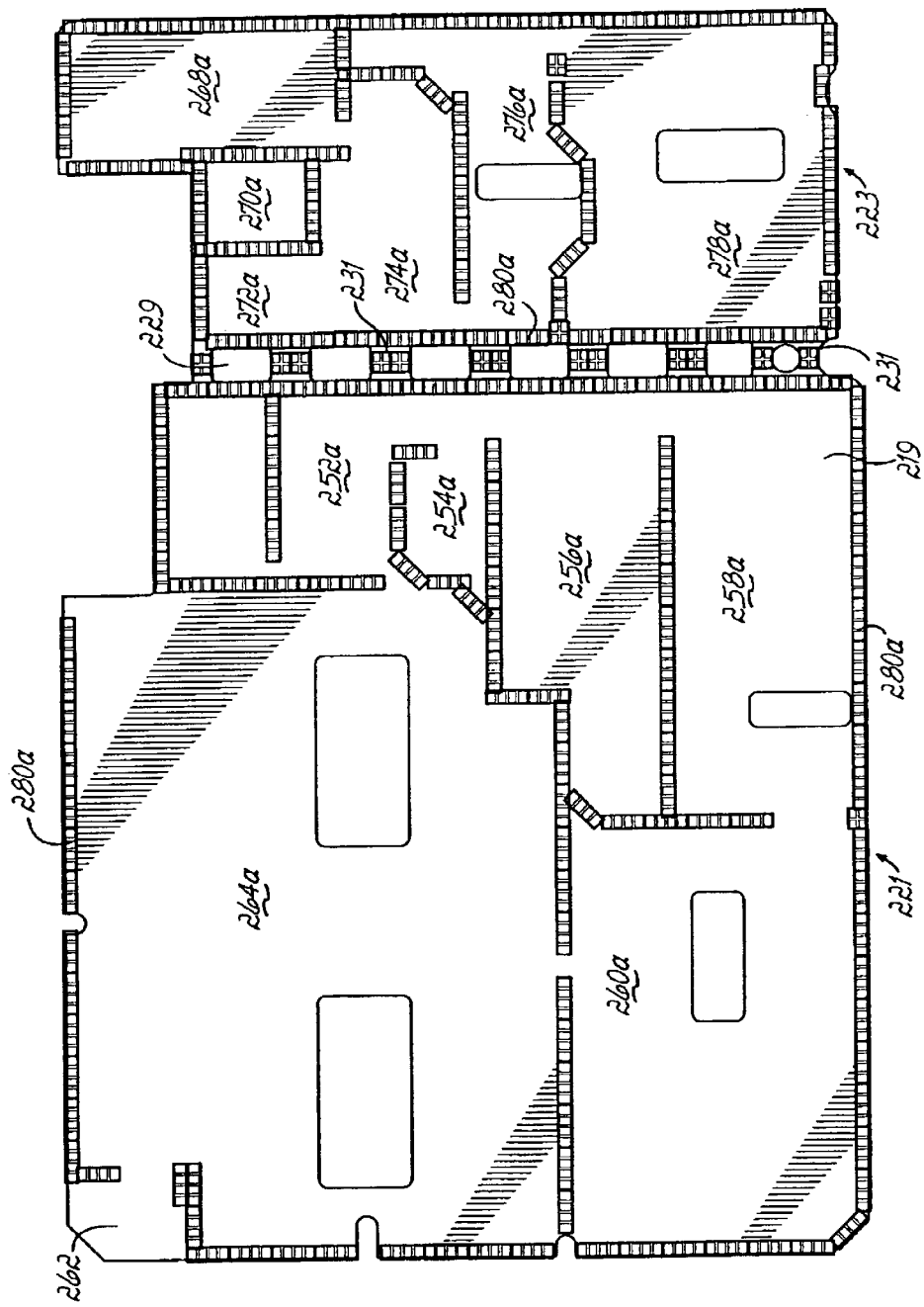
FIG. 3B is a top plan view of a circuit board containing both the main amplifier and error amplifier in accordance with one aspect of the invention.

Accordingly, herein, both individual board embodiments and a single board embodiment are disclosed. For example, FIG. 3 illustrates a bottom view of the inner lid 204 utilized with individual main amplifier and error amplifier boards. However, the embodiment as illustrated in FIGS. 3A and 3B, illustrate, respectively, a bottom view of an inner lid embodiment 204a, and an embodiment of a single circuit board incorporating both a main amplifier subcircuit and an error amplifier subcircuit, to be used with lid 204a.

The different embodiments 204, 204a of the inner lid are generally similar at a top side 226, and also have some similarities along the bottom side 220. Therefore, in describing the different embodiments of the invention herein similar reference numerals will generally be utilized to set forth any similar features between the embodiments 204, 204a of the inner lid.

A printed circuit board, such as a monitor and control board 208, which functions to monitor and control the operation of the feedforward power amplifier circuit 10, is mounted above a top side 226 of the inner lid 204, 204a. The top side 226 of the inner lid 204, 204a includes upper interstage cavities which, in accordance with one aspect of the invention, provide electromagnetic isolation for RF subcircuits mounted on the bottom side of the monitor and control board 208. The upper interstage cavities are formed by upper interstage walls 227 (as seen in FIGS. 2 and 9) which are configured in the inner lid to extend upwardly from the top side or surface 226 of the inner lid 204, 204a.

The inner lid 204, 204a has a generally horizontally disposed floor structure 205 which defines the top side 226 and the bottom side 220 of the inner lid. That floor structure generally defines a plane from which the upper interstage walls 227 extend upwardly and lower interstage walls 280 extend downwardly for defining the various interstage cavities in accordance with the principles of the present invention. That is, interstage walls extend generally in opposite directions from the plane defined by floor structure 205 to produce the isolation between subcircuits, which are positioned both above the inner lid 204, 204a, and below the inner lid. The designation of certain sides or walls as upper/lower or top/bottom is not limiting with respect to how the amplifier might ultimately be oriented.

In one embodiment of the invention, such walls are machined or cast directly into the inner lid for reducing the complexity of the shielding and reducing the overall manufacturing costs. Alternatively, the interstage walls might be otherwise coupled or fastened to the inner lid.

Figure 2:
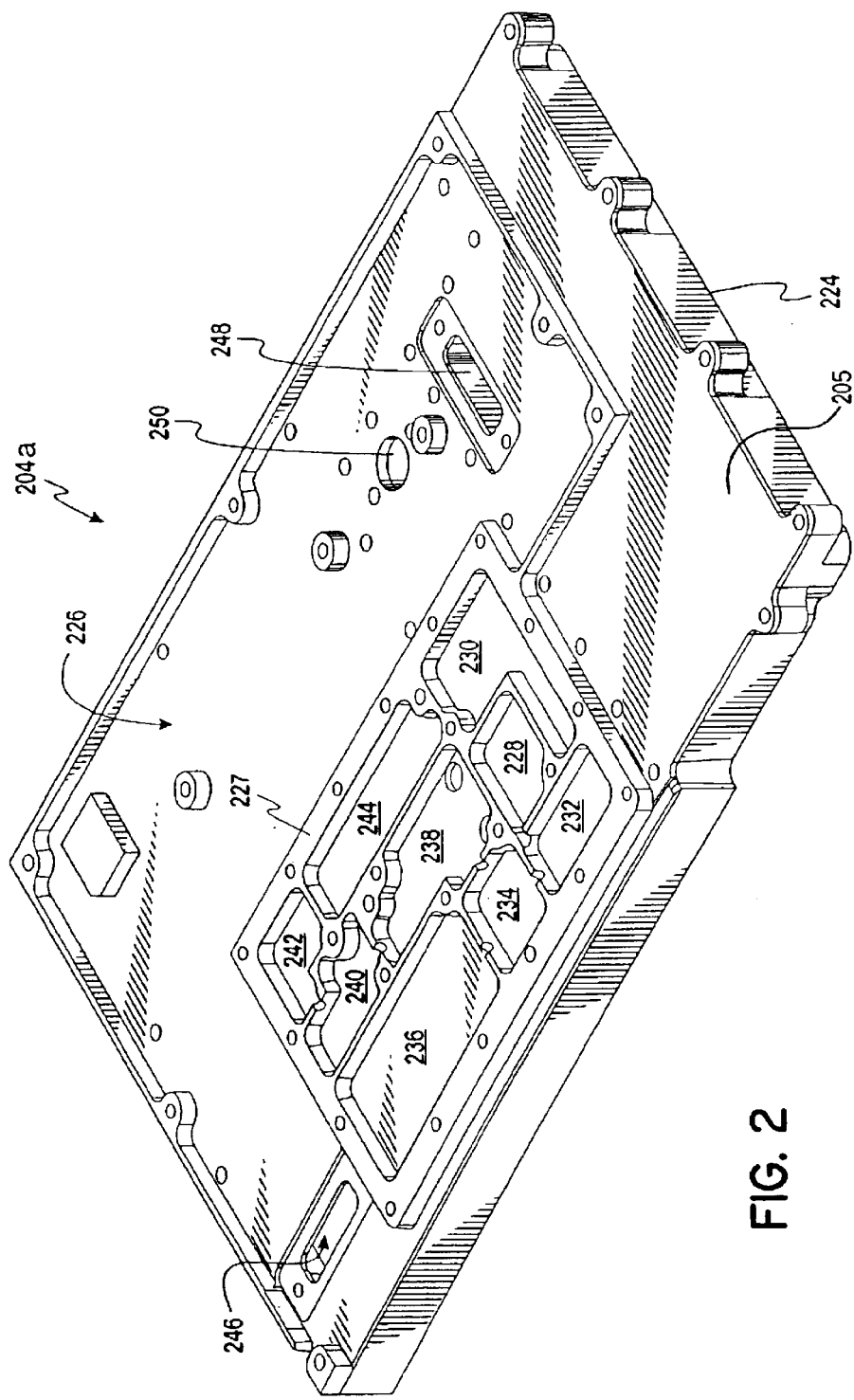
FIG. 2 is a perspective view of a top side of an inner lid structure according to one embodiment of the present invention.

As illustrated in FIGS. 2, 3, and 3A, the inner lid also includes side walls 224 which extend around the periphery of the inner lid and extend upwardly and downwardly with respect to the floor structure 205.

The interstage cavities on side 226, as shown in FIG. 2, include a forward power detector cavity 228 and a reverse power detector cavity 230 adapted, respectively, to isolate the forward output power detector subcircuit 18 and the reverse power detector subcircuit 22. Other interstage cavities on the top side 226 of the inner lid 204, 204a are adapted to hold components of the scanning receiver subcircuit 20. These include a power divider cavity 232, a downconverter cavity 234, a local oscillator cavity 236, a first intermediate frequency (IF) stage cavity 238, a second IF stage cavity 240, a third IF stage cavity 242, and a detector stage cavity 244. The purposes of the IF stages are twofold. The first purpose is to amplify a downconverted signal such that a detector is provided with appropriate signals for proper detector operation. The second purpose of the IF stages is to provide filtering so that the detector reacts solely to the desired signal.

Also shown in FIG. 2 are several through holes 246, 248, and 250, which allow signal connections, including filtered signal connections, between circuits positioned above and below the through holes on either side of the lid 204, 204a.

In one embodiment, a first through hole 246 is a main amplifier/monitor and control board connection through hole adapted to allow a filtered signal connection between the monitor and control board 208 positioned above the inner lid 204, 204a and the main amplifier subcircuit 14, and a second through hole 248 is an error amplifier/monitor and control board connection through hole adapted to allow a filtered signal connection between the monitor and control board 208 positioned above the inner lid 204, 204a and the error amplifier subcircuit 16 positioned below the inner lid 204.

Turning now to the bottom sides of lid 204, 204a, FIGS. 3, 3A illustrate different embodiments of the invention for use with multiple amplifier circuit boards and a single amplifier circuit board, respectively. Referring first to FIG. 3A, that figure illustrates a lid 204a for use with a single amplifier board that contains both the main amplifier and the error amplifier. The bottom side 220 of inner lid 204, 204a, according to one embodiment of the present invention, has two defined large cavities, a main amplifier cavity 214 and an error amplifier cavity 216, which are isolated using a dividing wall 218a. The dividing wall 218a provides electromagnetic isolation between the main amplifier subcircuit 14 and the error amplifier subcircuit 16. The wall 218a protrudes from the bottom side 220 of the inner lid 204. While providing the desired isolation between the error amplifier and the main amplifier, wall 218a allows for the positioning of the main amplifier subcircuit and the error amplifier subcircuit on the same circuit board. The board spans across wall 218a, and because of the unique configuration of the wall 218a, the desired electromagnetic isolation is maintained.

Specifically, referring to FIG. 3B, a circuit board 219 is shown which includes generally a main amplifier section 221, and an error amplifier section 223. When the board is positioned below the inner lid, as illustrated in FIG. 9, various of the cavities defined by the walls 280 of the inner lid 204a separate various of the subcircuits of both the main amplifier and the error amplifier. Furthermore, the dividing wall 218a provides the desired isolation between the main and error amplifiers.

Referring to FIG. 3A, wall 218a includes a series of end-to-end island portions or islands 225 with open areas 227 therebetween positioned along at least a portion of the wall's length. On the other hand, the single circuit board 219 has a series of cut-outs 229 which are milled into the circuit board 219. The various cut-outs 229 define spanning portions 231 which span between the main amplifier section 221 and the error amplifier section 223 of the board 219 to define a single circuit board in accordance with one aspect of the present invention. Referring to FIGS. 3A and 3B, the cut-outs 229 are positioned to correspond to the various islands 225 in the bottom side of lid 204a, such that when the lid 204a and board 219 are coupled together, a portion of the dividing wall 218a, in the form of the islands 225, extends through the board and contacts the chassis periodically along the length of the wall 218a, through the cut-outs. In that way, isolation can be maintained even though a single circuit board is utilized. This significantly reduces the complexity of production by having both the main and error amplifiers on a single board. The dividing wall 218a is thereby in contact with the chassis body floor 222 where the inner lid 204a and chassis body 206 are joined. Likewise, side walls 224 of lid 204a are in conductive contact with the chassis body floor.

As noted, the main amplifier and error amplifier cavities are separated by dividing wall 218a which electrically contacts the main chassis body floor 222 as shown in FIG. 9, at least along sections of its length. In this embodiment, the main amplifier cavity 214 and the error amplifier cavity 216 both contain various subcavities designed to enclose and isolate subcircuits of the main amplifier subcircuit 14 and the error amplifier subcircuit 16 through the walls 280. In the main amplifier cavity 214, the subcavities include a main amplifier input subcavity 252, a main amplifier input detector subcavity 254, a main amplifier phase shifter and variable attenuator subcavity 256, a main amplifier driver stage subcavity 258, a main amplifier final driver stage subcavity 260, and a DC power input subcavity 262, and a main amplifier final stage subcavity 264. In the error amplifier cavity 216, the subcavities include an error amplifier input subcavity 268, an error amplifier phase shifter and variable attenuator subcavity 270, an error amplifier carrier correction loop detector subcavity 272, an error amplifier driver stage subcavity 274, an error amplifier final driver stage subcavity 276, and an error amplifier final amplifier stage subcavity 278. The subcavities are separated by various lower interstage walls 280, which depend downwardly from floor 205 and which serve to isolate components within the subcavities from radio frequency interference from adjacent subcavities and also to add structural rigidity to the inner lid 204. Lower interstage wall gaps 282 are included in lower interstage walls 280 so that components may be connected to other components in different subcavities. The inner amplifier dividing wall 218, 218*a* is provided with fastener holes 284 which allow fasteners such as screws to pass through so that the inner lid 204 is securely fastened to the main chassis body 206. Other fastener holes 284 are located throughout the inner lid 204, to allow the monitor and control board 208 to be securely fastened to the inner lid 204 and to further provide for a more secure assembly when the inner lid 204 is secured to the main chassis body 206. Other embodiments may not use screw fasteners, but might use other means to fasten, such as rivets or solder along the perimeters.

FIG. 3 illustrates an inner lid 204 for an alternative embodiment of the invention which utilizes separate main amplifier and error amplifier boards. That is, each of the main amplifier and error amplifier and their respective components are located on individual circuit boards. As may be seen in FIG. 3, amplifier dividing wall 218 extends generally continuously across the inner lid to provide generally complete separation between the main amplifier subcircuit and the error amplifier subcircuit and their respective circuit boards. Therefore, FIG. 3 discloses a multiple board embodiment, rather than a single board embodiment as discussed with respect to FIGS. 3A and 3B. Other similar components, features and subcavities are set forth in FIG. 3 with reference numerals similar to those utilized in FIG. 3A.

When the inner lid 204 is positioned and coupled to the chassis body 206, the inner lid contacts the chassis body generally along the length of the dividing wall 218 for isolation between the main amplifier and error amplifier, as opposed to the discrete contact points provided by the islands 225 of wall 218*a*.

Referring to FIGS. 3B and 9, gaskets 280*a*, such as EMI gaskets, are coupled to the circuit board 219 wherever the walls 280, or 218*a*, contact the board 219. FIG. 3B illustrates the embodiment of the invention utilizing a single board for both the main amplifier and error amplifier. However, similar gaskets are utilized for the multiple board embodiment as well. The EMI gasket material is soldered or otherwise secured to the board at the various boundaries defined by the subcircuit components and the subcavities formed by the bottom of the inner lid 204, 204*a*. Referring to FIG. 3B, gasket material 280*a*, or rather, pieces of material, extend end-to-end along where the dividing wall 218*a* would engage the chassis. Such gasketing is to address those areas between the islands 225 where the board makes contact with the wall open areas 227 between the islands 225. However, in a version utilizing separate boards, generally gasketing material along the dividing wall 218 would not be necessary, as the wall would contact the chassis generally along its length. The gasketing material 280 is a compressible Electro Magnetic Interference (EMI) material used to fill gaps remaining between the lower interstage walls 280 and the respective circuit boards or board. In one embodiment, the gasketing may be that manufactured by the W. L. Gore Company, (Goreshield SMT-EMI Gasketing, Gore Part No. 3645-10).

In this embodiment, a strip of gasketing is attached to a strip of metal, and the metal is soldered onto a circuit board along with the circuit components. This type of gasketing is preferred for its ability to complete an RF and EMI isolating Faraday cage when circuit board and chassis tolerances are such that full intimate metal-to-metal and metal-to-board contact cannot be guaranteed over the entire desired mating area. Another embodiment involves application of a dispensed bead of gasketing along inner lid side walls 224 and/or along lower interstage walls 280. One type of dispensed gasketing that may be used in this embodiment is Chomerics, Cho-Form Form-In-Place EMI gasketing.

Figure 4:
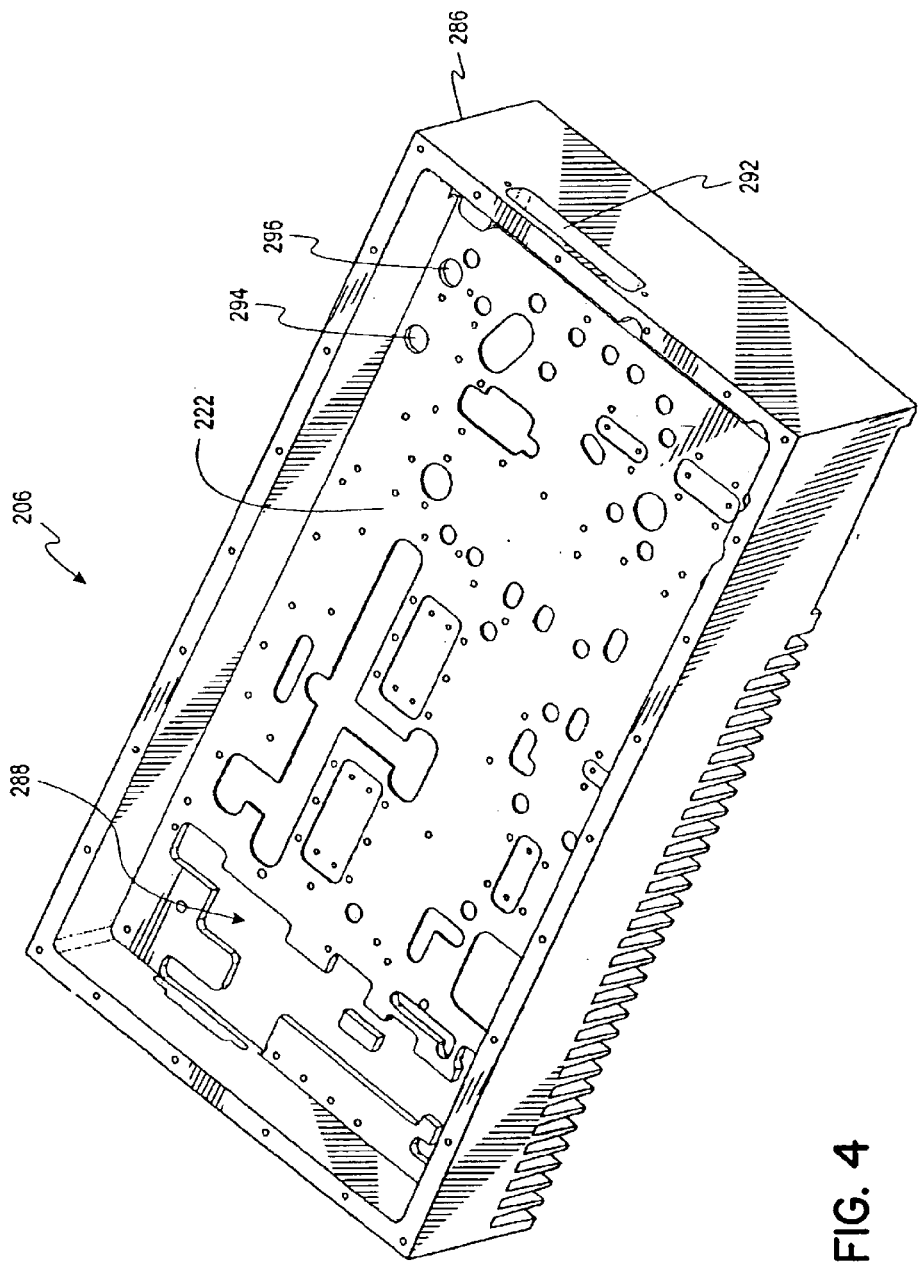
FIG. 4 is a perspective view of a main chassis body according to one embodiment of the present invention.

Turning now to FIG. 4, a perspective view of the main chassis body 206 shows the main chassis body floor 222 having several through holes allowing for connections through the main chassis body floor 222 and through the side walls 286 of the main chassis body 206. The main chassis body 206 also has depressions 288 provided in the main chassis body floor 222 to accommodate through-hole components, board bottom-side traces, and chassis mounted components. In one embodiment, through holes through the main chassis body floor 222 are provided to allow connections between a delay line subcircuit portion 290 and the main amplifier subcircuit 14 and error amplifier subcircuit 16. Through holes visible in FIG. 4 include a main connector through hole 292 to accept a main connector including connectors for the input 100 and output 112, a main amplifier output through hole 294 adapted to allow connection between the main amplifier subcircuit 14 and the delay line subcircuit portion 290, and an error amplifier input through hole 296 adapted to allow connection between the error amplifier subcircuit 16 and the delay line subcircuit portion 290.

Figure 5:
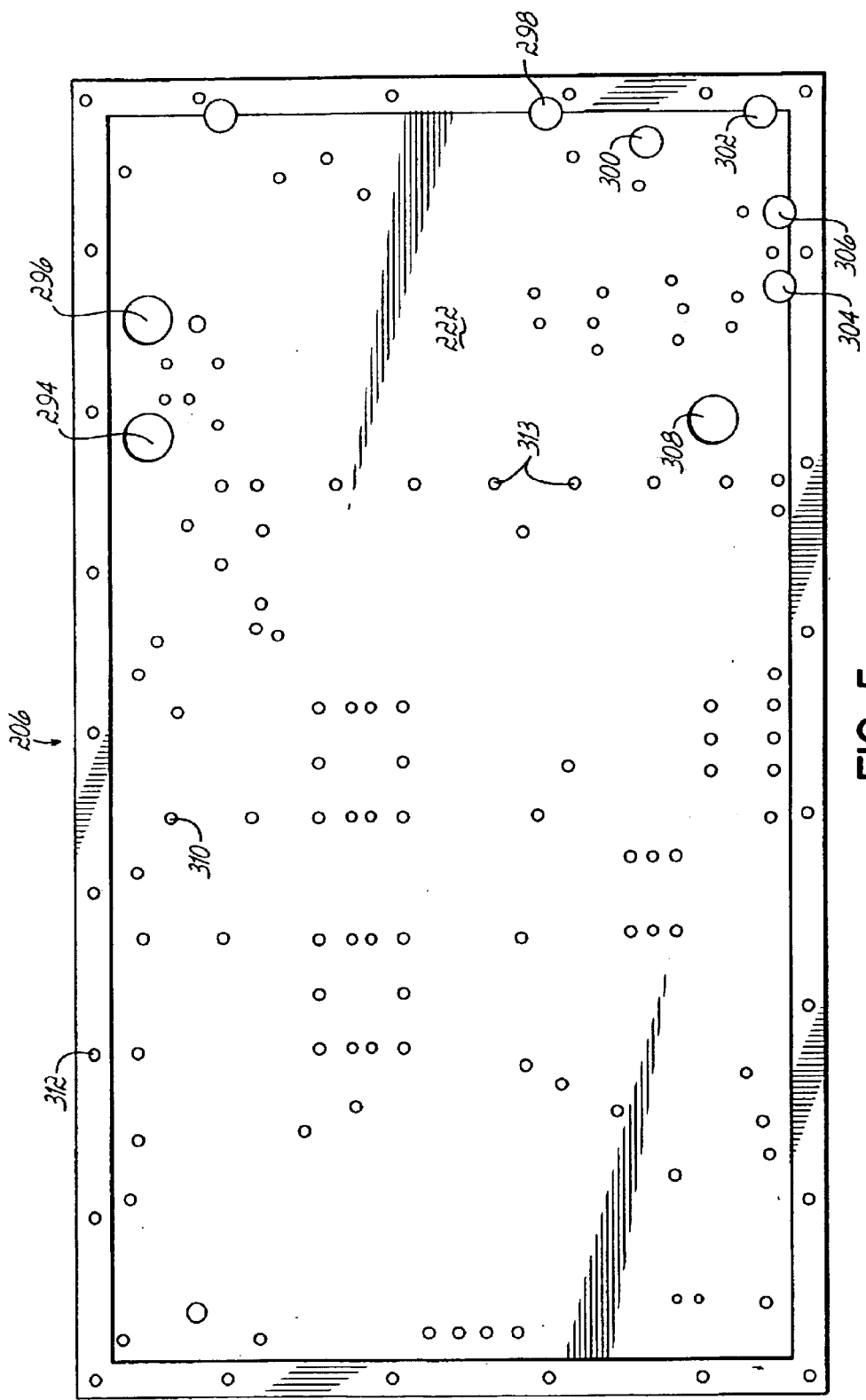
FIG. 5 is a top view of a main chassis body according to one embodiment of the present invention.

FIG. 5 shows a top view of the main chassis body 206 and floor 222, including through holes and fastener holes. Through holes visible in FIG. 5 include a main amplifier input through hole 298 adapted to allow connection between the delay line subcircuit portion 290 and the main amplifier subcircuit 14, an input through hole 300 adapted to allow connection between the input 100 and the delay line subcircuit portion 290, and an output through hole 302 adapted to allow connection between the output 112 and the delay line subcircuit portion 290. Also shown in FIG. 5 are a forward power detector through hole 304 adapted to allow connection between a forward power detector subcircuit 18 and the delay line subcircuit portion 290, a reverse power detector through hole 306 adapted to allow connection between a reverse power detector subcircuit 22 and the delay line subcircuit portion 290, and an error amplifier output through hole 308 adapted to allow connection between the error amplifier subcircuit 16 and the delay line subcircuit portion 290. Fastener holes shown in FIG. 5 include main chassis body floor fastener holes 310 adapted to allow fastening of main amplifier subcircuit 14 and error amplifier subcircuit 16 components to the main chassis body floor 222 and outer lid fastener holes 312 adapted to allow fastening of an outer lid 314 (visible in FIG. 9) to the main chassis body 206 and inner lid fastener holes 313 for fastening the inner lid to the chassis 206.

Figure 6:
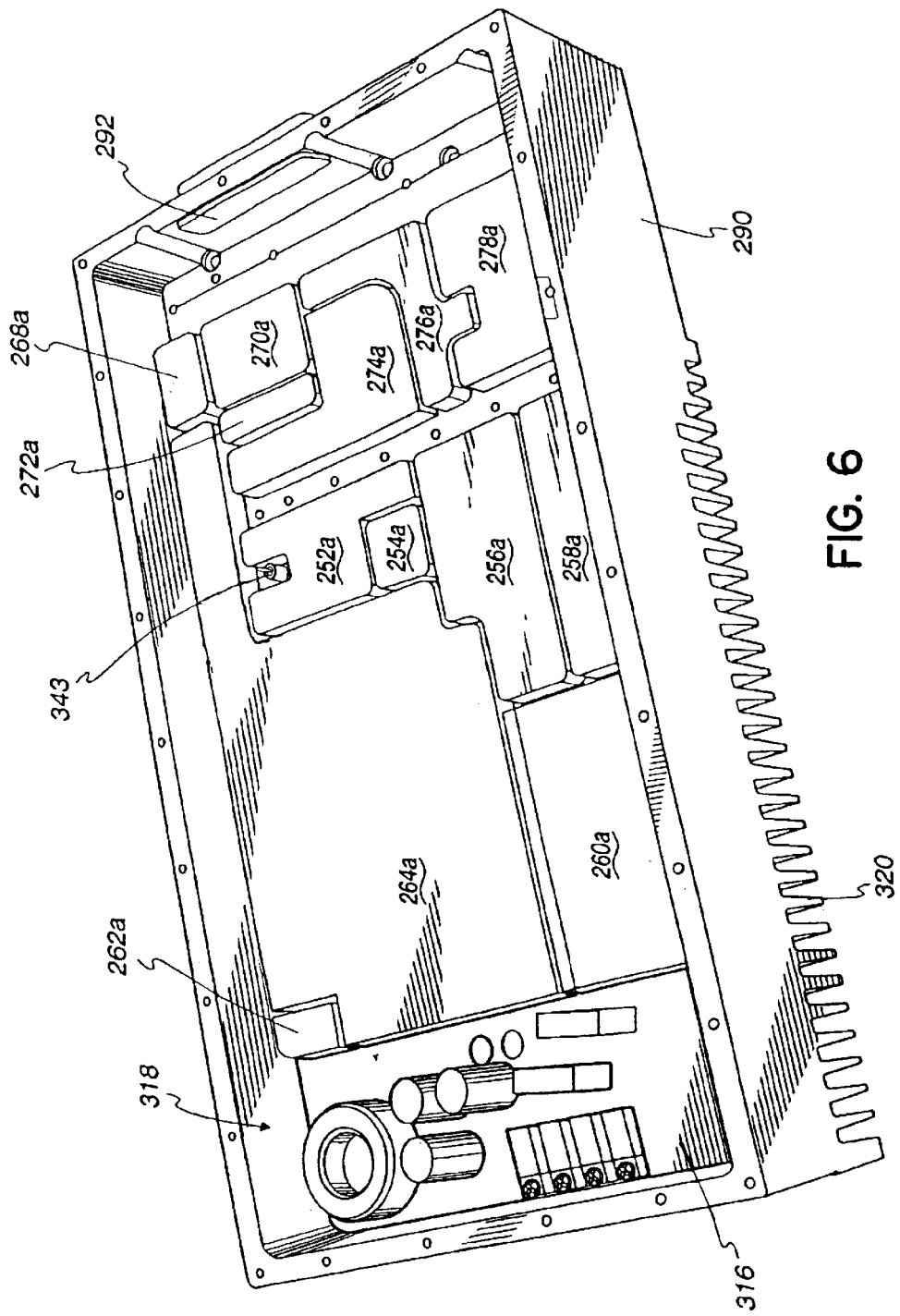
FIG. 6 is a perspective view of a main chassis body according to the present invention housing a main amplifier and an error amplifier.

FIG. 6 shows the main chassis body 206 housing the main amplifier subcircuit 14 and the error amplifier subcircuit 16. The main and error amplifier subcircuits may be on separate boards or may be on a single board, as illustrated in FIG. 3B. FIG. 3B uses similar reference numerals to FIG. 6 to show the location of the various subcircuits. An amplifier power supply 316 is housed within an amplifier power supply cavity 318. Cooling fins 320, integral to the main chassis body 206, serve to dissipate heat generated by the amplifier power supply 316, the main amplifier subcircuit 14, and the error amplifier subcircuit 16. The delay line subcircuit portion 290 of the main chassis body 206 is shown in a position beneath the error amplifier subcircuit 16 in accordance with one aspect of the invention. The present invention eliminates significant delays between the input and output from the error amplifier to the delay line circuit by locating the delay line circuit below the error amplifier, machining or configuring the delay line subcircuit and delay filters directly into the chassis, and providing direct connections between the error amplifier and the delay line subcircuit.

FIG. 6 shows the components and subcircuits of the main amplifier subcircuit 14 which are isolated by the dividing wall 218, 218a and lower interstage walls 280 of the inner lid 204. The subcircuits and components are numbered in agreement with the numbering of their corresponding cavities shown in FIGS. 3 and 3A. These subcircuits and components include a main amplifier input subcircuit 252a, a main amplifier input detector subcircuit 254a, a main amplifier phase shifter and variable attenuator subcircuit 256a, a main amplifier driver stage 258a, a main amplifier final driver stage 260a, a main amplifier DC power input 262a, and a main amplifier final amplifier stage 264a. A portion of the main amplifier final amplifier stage 264a extends above the delay line subcircuit portion 290, to provide for a short connection between the main amplifier subcircuit 14 and the delay line subcircuit portion 290.

FIG. 6 further shows the components and subcircuits of the error amplifier subcircuit 16 which are isolated by the dividing wall 218, 218a and the lower interstage walls 280 of the inner lid 204. These subcircuits and components include an error amplifier input subcircuit 268a, an error amplifier phase shifter and variable attenuator subcircuit 270a, an error amplifier carrier correction loop detector 272a, an error amplifier driver stage 274a, an error amplifier final driver stage 276a, and an error amplifier final amplifier stage 278a. As noted above, the error amplifier subcircuit 16 is positioned generally directly above the delay line subcircuit portion 290 in accordance with one feature of the invention to provide for direct coaxial connector connections between the error amplifier subcircuit 16 and the delay line subcircuit portion 290 in accordance with another feature of the invention. The various combination of features, including the error amp positioned above the delay line circuit which is machined and/or formed in the chassis, and particularly including the direct interconnect, using no coaxial cables, provides several key benefits for the present design. For example, a shorter overall delay is required of the main delay filter 140. This provides a desirable smaller physical size and a lower insertion loss for the main delay filter 140. Furthermore, the invention features result in less loss and a higher amplifier power efficiency which is a significant benefit of this inventive amplifier design and packaging technique.

Figure 10:
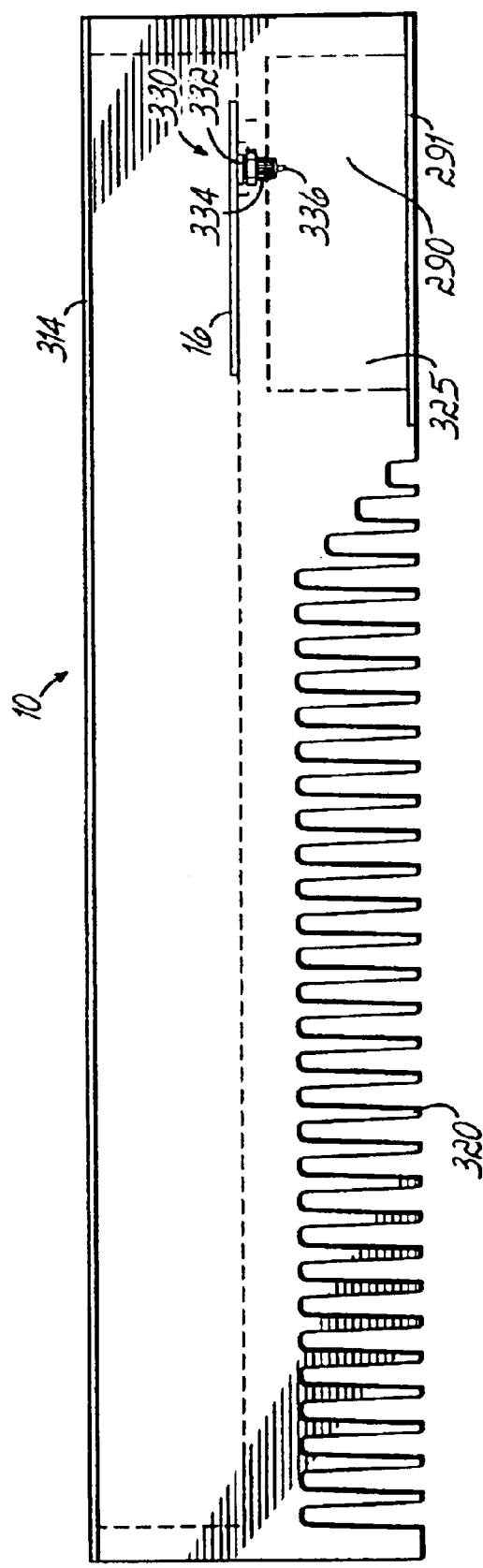
FIG. 10 is a partial cross-sectional view of a power amplifier illustrating the connection between an error amplifier subcircuit and delay line subcircuit according to one aspect of the present invention.
Figure 11:
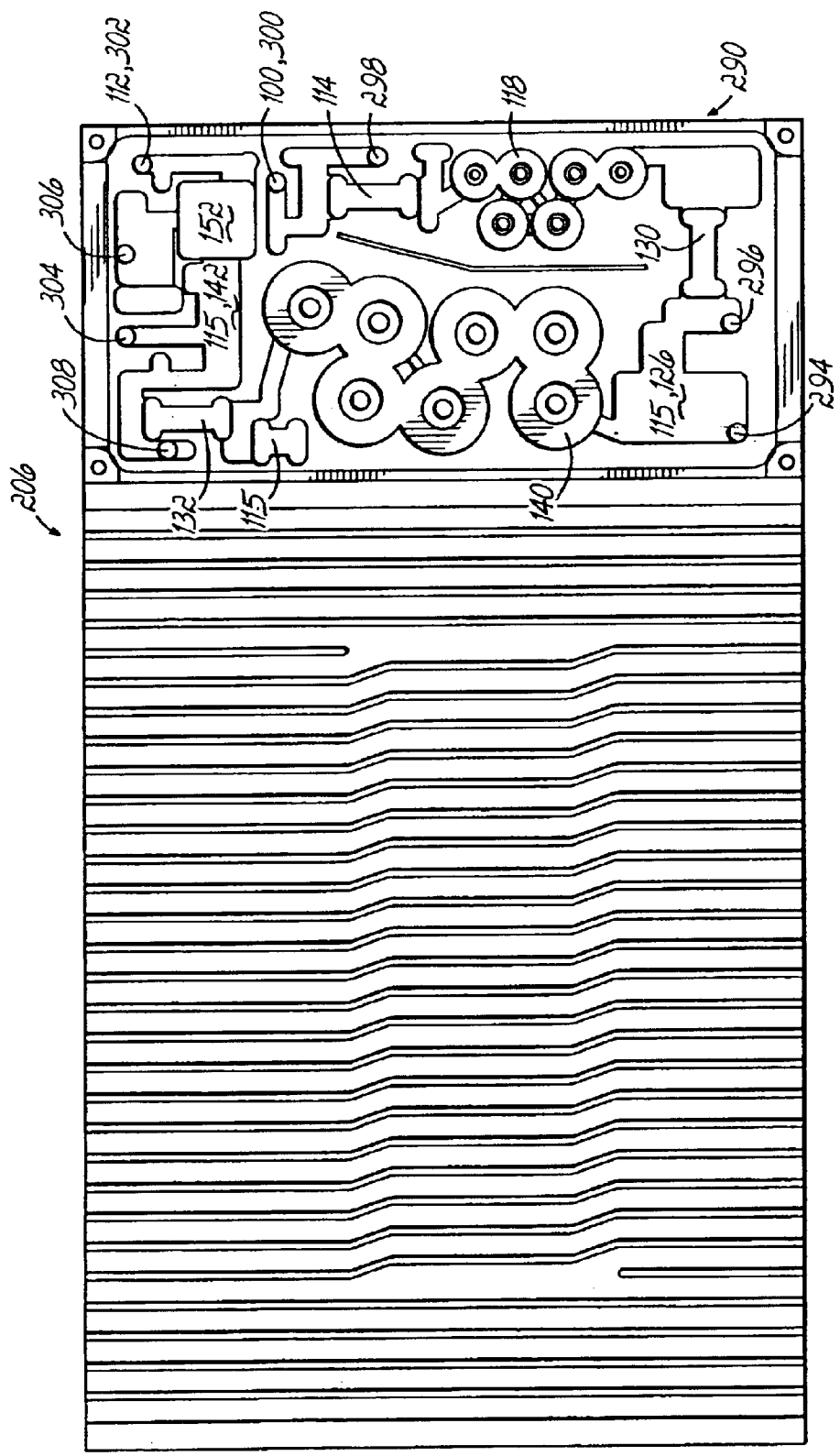
FIG. 11 is a bottom view, in partial cross-section of one embodiment of the invention, illustrating a delay line subcircuit.

FIGS. 10 and 11 show side and bottom views, respectively, of the chassis including the delay line cavity and the direct coaxial interconnection between the error amplifier and the delay line subcircuit.

The main chassis body 206 houses the delay line subcircuit 12 within the delay line subcircuit portion 290, which, as shown in FIGS. 9 and 10, is located below the main chassis body floor 222, next to the fins 320. In the embodiment of the circuit shown in FIG. 1, eight connectors, demarcated in FIG. 1 by the connection arrows ("-->>--") and circles, are provided between the delay line filter subcircuit 12 and other subcircuits of the feedforward power amplifier circuit 10. The circles are assigned reference numerals corresponding to the connection holes shown in FIG. 5. In one embodiment, these connections may be provided by eight press-fit blind-mate RF coaxial connectors which protrude through the main chassis body floor 222 to allow RF interconnections between the delay line filter subcircuit 12 and other subcircuits.

Referring to FIG. 10, a side view of the chassis main body 206 and outer lid 314 is shown similar to that shown in FIG. 9, except without the inner lid and main amplifier board illustrated. A delay line lid 291 is shown covering a delay line cavity 325 formed in the chassis for containing and supporting the delay line subcircuit components. One suitable delay line subcircuit portion 290 of the chassis is illustrated in FIG. 11 and is discussed further hereinbelow. Turning again to FIG. 10, one suitable direct-connection coaxial connector 330 is illustrated. Connector 330 includes a coaxial plug 332 positioned at an end of the connector proximate to the error amplifier subcircuit 16, and particularly proximate to the circuit board which contains the error amplifier subcircuit. As noted above, that circuit board may either be an individual board, or may be a portion of a larger, single board which holds both the main amplifier subcircuit and the error amplifier subcircuit. In any case, the coaxial plug 332 is appropriately electrically connected to a suitable connection point of the error amplifier board, such as by being soldered to the error amplifier board. The coaxial jack portion 334 of the connector is then press fit into an appropriate chassis through hole, such as through hole 308 or 296, as illustrated in FIG. 5. A nipple portion 336 at the end of the coaxial jack portion 334 provides for connection to a suitable point within the delay line subcircuit portion 290, according to procedures known to a person of ordinary skill in the art. The unique positioning of the error amplifier board and error amplifier subcircuit 16 and components above the delay line subcircuit portion 290 and circuit 12 provided by the invention, in combination with the delay line subcircuit portion being integrally formed and positioned within the chassis body 206, allows the direct press-fit coaxial connection between the error amplifier 16 and the delay line subcircuit 12, thus eliminating cable interconnects which introduce delays and which must then be addressed by the delay line filter 140 and the subcircuit. Such additional delays cause additional power losses within the delay line subcircuit, and thereby reduce the efficiency of the overall amplifier. The present invention enhances efficiency by providing direct interconnection between the error amplifier and the delay line subcircuit to reduce such delays and power losses. In a preferred embodiment, both the input and output interconnects 330 and 332 for the error amplifier utilize direct interconnects, as illustrated in FIG. 10. A single interconnect 330 is illustrated in FIG. 10, but it will be readily understood that multiple such interconnects can be utilized.

The delay line subcircuit portion 290 is formed in the chassis body 206 and includes delay line subcircuit metalwork adapted to guide and delay RF signals, in accordance with principles known to those skilled in the art. In accordance with one aspect of the invention, the metal work portions, which generally represent the delay filters 118, 140 of the delay line subcircuit 12, are fabricated into chassis body 206, and generally into cavity 325 (see FIG. 10). The delay line subcircuit portion may be provided with a removable lower lid 291 to allow for assembly. The delay line subcircuit portion 290 and cavity 325 also will generally contain circuit boards, including drop-in coupling and transition circuitry provided within the delay line subcircuit 12. For example, as illustrated in one embodiment, the delay line subcircuit utilizes two delay lines or filters 118, 140, five couplers (114, 130, 126, 132, 142), and a circulator 152. These circuits may comprise further subcircuits within the delay line subcircuit portion 290. Coupling paths for the circuits may be provided in the delay line subcircuit portion. The delay line subcircuit portion metalwork, in one embodiment, includes cylindrical cavities which act as resonating filters to accomplish signal delays. Such resonating cavity delay structures are known to persons of ordinary skill in the art and designs for such structures, along with supporting circuitry, are commercially provided by companies such as Andrew, Filtronic Comtek and Remec, as mentioned above. The provision of a delay line subcircuit portion 290 integral with the feedforward power amplifier chassis 202 and positioned below the error amplifier, imparts a number of benefits to the design, construction, and use of the feedforward power amplifier 10, as discussed The positioning of the error amplifier subcircuit in an error amplifier subcircuit cavity 216 directly above the delay line filter subcircuit 12 in cavity 325 and the use of direct connect coax connectors minimizes the required length of an output delay line and the size of filter 140 to a significant extent, since no significant extra delay is added to the error amplifier subcircuit from lossy interconnect cables. The resulting direct delay line connection results in a lower delay line loss, which proportionally increases overall efficiency of the feedforward power amplifier 10 of the invention.

More specifically, the use of an integrated delay line filter subcircuit 12, according to the present invention, and the direct interconnect, results in shorter delay in the main delay filter 140, less signal loss, smaller size, and higher efficiency of the feedforward power amplifier 10. In one embodiment, the delay line subcircuit portion 290 includes two delay filters and lines, but other embodiments may house one or more than two delay lines for providing required signal delays. A first delay filter or line included in the delay line subcircuit portion 290 of the disclosed embodiment is the main delay filter 140 and a second delay filter or line included in the delay line subcircuit portion is the feedforward delay filter 118. In some embodiments, delays provided by the delay line subcircuit portion 290 may range from about 7 ns to about 15 ns, though longer or shorter delays may be provided based on amplifier design considerations. In one embodiment, the delay provided by the main delay filter 140 is around 7.25 ns and the delay provided by the feedforward delay filter 118 is around 11 ns.

Referring to FIG. 11, a bottom view of the chassis body 206 is shown in partial cross-section, illustrating schematically the delay line subcircuit 290 which includes delay lines or filters 140, 118 along with various of the other components, such as couplers and circulators associated with the delay line subcircuit. The various circuits and components other than the resonator cavities of the delay lines 118 and 140, are positioned on appropriate circuit boards with appropriate connectors as dictated by the specific design of the delay line subcircuit. It will be understood that other, different components might be utilized in a different arrangement from that shown in the embodiment illustrated in FIG. 11. Reference numerals are set forth on FIG. 11 to correspond to the various connection points and components of the design illustrated in FIG. 1. An input signal 100 is directed to both the main amplifier at through hole 298, and through a coupler 114 to the feedforward path. In the feedforward path, the signal is directed through the delay filter 118 in the form of the resonating cavities machined and constructed into the chassis body 206 in accordance with one aspect of the invention. Various other components of the delay line subcircuit 290 are illustrated along the signal paths through the amplifier. Delay filter 140 is also in the form of resonating cavities. The various through holes and connection points into and out of the delay line subcircuit are illustrated with reference numerals corresponding to those in FIG. 1 and FIG. 5.

Figure 8:
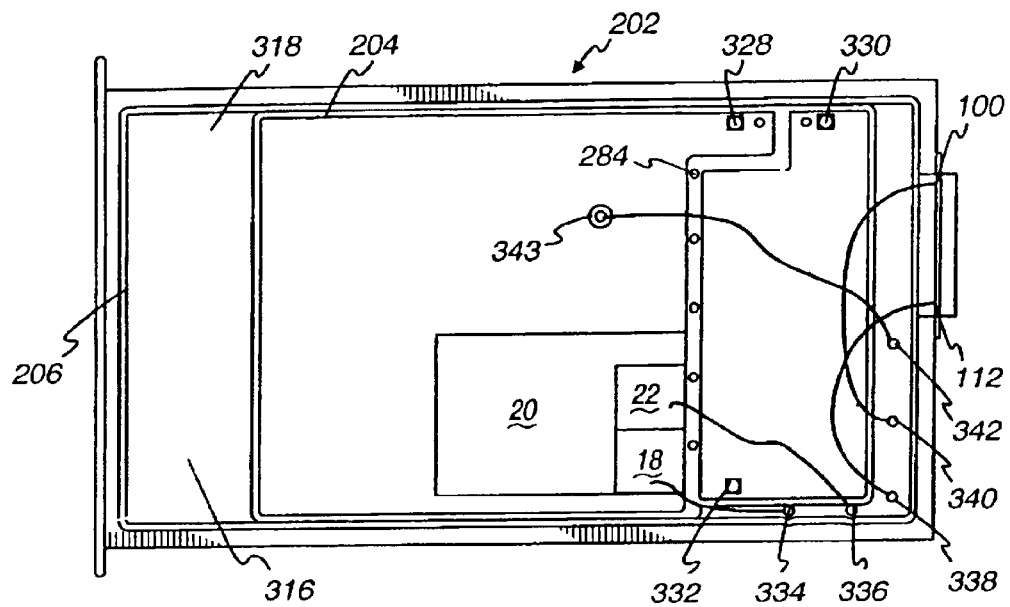
FIG. 8 is a top view of a power amplifier chassis according to one embodiment of the present invention.

Turning now to FIG. 8, a top cutaway view of the feedforward power amplifier 10 shows connections between components of the feedforward power amplifier 10. Connections between components of the feedforward power amplifier may be provided by the direct interconnects noted above, or cabled interconnects. Direct interconnects are preferably used for key connections where delay or insertion loss from a cabled interconnect would adversely affect the performance of the feedforward power amplifier circuit 10, and they consist of blind-mate RF coaxial connectors integrally connected to each other. As shown in FIG. 8 and as discussed above, direct interconnects with the delay line filter subcircuit 12 in the delay line subcircuit portion 290 include an error amplifier input interconnect 330 and an error amplifier output interconnect 332. Other interconnects may be cabled between the delay line filter subcircuit 12 and circuit boards containing other subcircuits. Cabled interconnects have two coaxial terminations connected by a coaxial cable. In one embodiment, as shown in FIG. 8, these interconnects include a main amplifier output interconnect 328, a forward power interconnect 334, a reverse power interconnect 336, an output interconnect 338, an input interconnect 340, and a main amplifier input interconnect 342.

Figure 7:
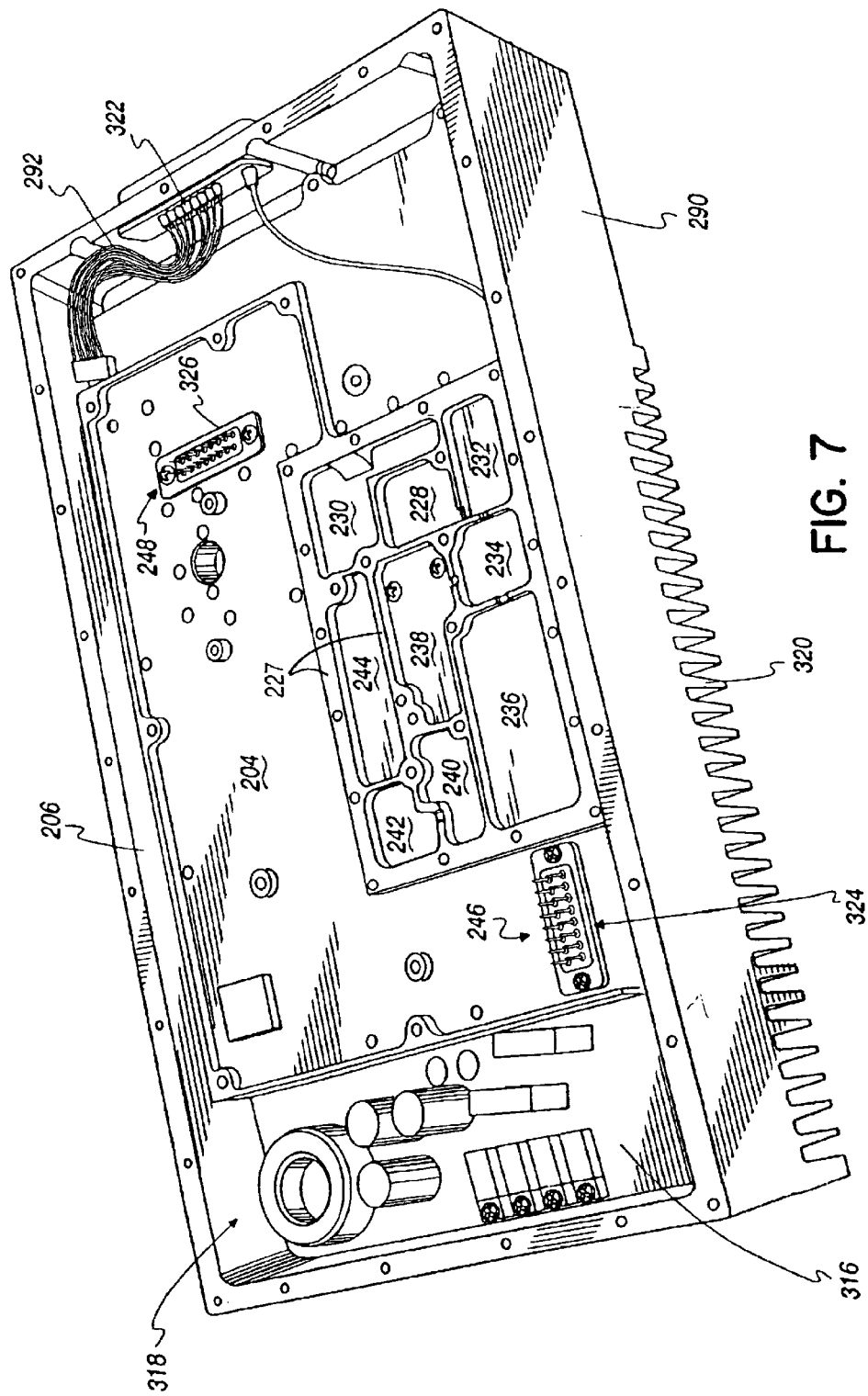
FIG. 7 is a perspective view of a main chassis body with an inner lid structure in place according to one embodiment of the present invention.

Turning now to FIG. 7, the inner lid 204 is shown positioned within the main chassis body 206 to cover, contain, and isolate the subcircuits on the board or boards. A main connector 322 is shown extending through the main connector through hole 292. The main connector 322 includes connectors for all input and output signals delivered to and from the feedforward power amplifier 10. A main amplifier/monitor and control board EMI filter-type connector 324 is shown extending through the main amplifier monitor and control board connection through hole 246 and an error amplifier/monitor and control board EMI filter-type connector 326 is shown extending through the error amplifier/monitor and control board connection through hole 248. As shown in FIG. 9, the monitor and control board rests atop and is fastened to the inner lid 204 when the feedforward power amplifier 10 is fully constructed.

In a completely constructed amplifier, the relationship between the subcircuits of the feedforward power amplifier 10, and the chassis 202 consisting of the main chassis body 206, and the inner lid 204 is further illustrated in FIG. 9, which shows a cross-sectional view of the feedforward power amplifier 10 on one embodiment of the invention. The inner lid side walls 224 and the inner lid amplifier dividing wall 218, 218a are in electrical contact with the main chassis body floor and form the main amplifier cavity 214 and the error amplifier cavity 216. In a single board version of the invention, with both the main amplifier and error amplifier on a single board, the wall 218a is constructed with islands 225 which protrude through the board cutouts 229, thus allowing the board to span across the wall. In the multiple board embodiment, the wall 218 generally contacts the chassis floor along its length. Lower interstage walls 280 are shown extending downward from the bottom side 220 of the inner lid 204. The compressible electromagnetic interference (EMI) shield gasketing material 280a is used to fill gaps remaining between the lower interstage walls 280 and their respective circuit boards.

The interstage cavities along the top of the inner lid 204 are bounded by the inner lid 204, including the inner lid side walls 224 and the upper interstage walls 227, and the monitor and control board 208. The present invention has an integral lid providing shielding both on an upper surface and a lower surface for different components of the amplifier. This forms a very compact, low-cost and simple design which provides the desired isolation and shielding between the various subcircuits. In addition to their shielding function, the upper interstage walls 227 provide a surface for mounting the monitor and control board 208. The subcavities along the bottom of the inner lid 204 are bounded by the inner lid 204, including the inner lid side walls 224, the lower interstage walls 280, and the inner amplifier dividing wall 218, the main amplifier subcircuit 14 and the error amplifier subcircuit 16. Due to the compressible EMI shield gasketing 227a and 280a, the side walls 224 of the inner lid 204, the lower interstage walls 280, the inner lid amplifier dividing wall 218 and the lower surface of the inner lid 204, all subcircuits and components of the feedforward power amplifier 10 which might otherwise interfere with each other's operation are shielded. In one embodiment, the lower interstage walls 280 extend downwardly from the bottom side 220 of the inner lid 204 to within approximately 20 mils of their respective circuit board surfaces to electromagnetically isolate components and subcircuits of the main amplifier subcircuit 14 and the error amplifier subcircuit 16. Though a particular conformation for the inner lid 204 and the main chassis body 206 has been described, it is to be understood that alternative arrangements of interstage cavities and subcavity walls may be utilized for different circuit designs.

The chassis 202 of the present invention may be manufactured of a variety of materials and in a variety of sizes. In one embodiment, aluminum is used for the complete chassis and aluminum is particularly preferred for its ability to conduct heat in the main chassis body 206. Aluminum alloys may also be used. In one embodiment, zinc is used for shielding in the inner lid 204. Though chassis, according to the present invention, are preferably cast out of aluminum or aluminum alloys, it is to be understood that chassis according to the present invention may be formed by other methods, including machining of metals, casting of metalized plastic, and casting plastic with surface metallization applied later.

The design of the present invention preferably achieves isolation between subcircuits greater than approximately 100 dB (decibels). The isolation achieved according to the present invention is comparable to that achieved through the use of a multiple separate chassis for each subcircuit which is a larger, more complex and more expensive design. In one embodiment, the inner lid 204 is connected to the main chassis body 206 via connection screws located along the inner amplifier dividing wall 218. Chassis wall, floor, lid, and side thicknesses of at least approximately 70 mils are used in the disclosed embodiment of the present invention, though thicknesses greater than or less than 70 mils may be used, based on casting ability and weight and size considerations.

Electromagnetic isolation is achieved because a Faraday cage is constructed around all cavities having components producing electromagnetic interference. Further, the combination of normally separate chassis into a single chassis design reduces the cost of chassis casting or machining. The cost of casting or machining a separate delay line subcircuit portion is reduced to the cost of machining of the delay line subcircuit portion 290 into the main chassis body 206. Further, the elimination of interconnect cables between separate chassis, the elimination of individual shield assemblies, and the reduction of fastening hardware result in lower cost because less material is used than in conventional amplifier construction.

While the present invention has been described with reference to one or more particular embodiments, those skilled in the art will recognize that many changes may be made thereto without departing from the spirit and scope of the present invention. Each of these alternative embodiments and obvious variations thereof is contemplated as falling within the spirit and scope of the claimed invention, which is set forth in the following claims.

What is claimed is:

1. An amplifier comprising:
    a main amplifier subcircuit and an error amplifier subcircuit each directly mounted together on a single circuit board;
    a chassis body;
    a lid structure for positioning with the chassis body to contain the circuit board and main and error amplifier subcircuits;
    one of the lid structure and the chassis body having generally solid side walls extending therefrom for defining a main amplifier cavity with subcavities to contain subcircuits of the main amplifier subcircuit and an error amplifier cavity with subcavities to contain subcircuits of the error amplifier subcircuit, the side walls extending to contact the circuit board to isolate the subcircuits;
    the one of the lid structure and chassis body further including a generally solid dividing wall, of greater thickness than the side walls, extending between the main amplifier subcircuit and the error amplifier subcircuit, the dividing wall having multiple broad islands extending therefrom, the multiple islands passing through multiple cut-outs formed in the circuit board between the main amplifier subcircuit and respective cavity and the error amplifier subcircuit and respective cavity to electrically couple to the other of the lid structure and chassis body to separate the amplifier cavities and electrically isolate the main and error amplifier subcircuits.

2. The amplifier of claim 1 wherein the side walls are integrally formed with the lid structure.

3. The amplifier of claim 1 wherein the side walls extend from the lid structure and further comprising additional subcircuits, the lid structure including at least one other side wall extending from a side of the lid structure opposite the side wall for isolating subcircuits on both sides of the lid structure.

4. The amplifier of claim 1 further comprising a gasket coupled between the side wall and a circuit board for isolating the subcircuit.

5. A method of isolating subcircuits of an amplifier comprising:

mounting each of a main amplifier subcircuit and an error amplifier subcircuit directly on a single circuit board in a chassis body;

positioning a lid structure with the chassis body to contain the circuit board and amplifier subcircuits, at least one of the lid structure and the chassis body having generally solid side walls extending therefrom for defining a main amplifier cavity with subcavities to contain subcircuits of the main amplifier subcircuit and an error amplifier cavity with subcavities to contain subcircuits of the error amplifier subcircuit;

positioning the single circuit board so that the side walls extend to contact the circuit board to isolate the subcircuits within the main amplifier cavity and the error amplifier cavity;

positioning a generally solid dividing wall, depending from one of the lid structure and the chassis body, between the main amplifier cavity and the error amplifier cavity, the dividing wall having a greater thickness than the side walls;

passing multiple broad islands, extending from the dividing wall, through multiple cut-outs formed in the circuit board between the main amplifier subcircuit and respective cavity and the error amplifier subcircuit and respective cavity to electrically couple to the other of the lid structure and chassis body to separate the amplifier cavities and electrically isolate the main and error amplifier subcircuits.

6. The method of claim 5 wherein the side walls are integrally formed with the lid structure.

7. The method of claim 5 wherein the side walls extend from the lid structure and the lid structure includes at least one other side wall extending from a side of the lid structure opposite the other side walls, and further comprising positioning additional subcircuits proximate the one other side for isolating subcircuits on both sides of the lid structure.

8. The method of claim 5 further comprising coupling a gasket between the side wall and a circuit board for isolating the subcircuit.

9. An amplifier comprising:

a main amplifier subcircuit and an error amplifier subcircuit each directly mounted together on a single circuit board;

a chassis body;

a lid structure for positioning with the chassis body to contain the circuit board and main and error amplifier subcircuits;

the lid structure having generally solid side wails extending therefrom for defining a main amplifier cavity with subcavities to contain subcircuits of the main amplifier subcircuit and an error amplifier cavity with subcavities to contain subcircuits of the error amplifier subcircuit, the side walls extending to contact the circuit board to isolate the subcircuits;

the lid structure further including a generally solid dividing wall, of greater thickness than the side walls, extending between the main amplifier subcircuit and the error amplifier subcircuit, the dividing wall having multiple islands extending therefrom, the multiple islands passing through multiple cut-outs formed in the circuit board between the main amplifier subcircuit and respective cavity and error amplifier subcircuit and respective cavity to electrically couple to the chassis body to separate the amplifier cavities and electrically isolate the main and the error amplifier subcircuits.

* * * * *

UNITED STATES PATENT AND TRADEMARK OFFICE
CERTIFICATE OF CORRECTION

PATENT NO. : 6,937,482 B2
APPLICATION NO. : 10/733564
DATED : August 30, 2005
INVENTOR(S) : Kooker et al.

It is certified that error appears in the above-identified patent and that said Letters Patent is hereby corrected as shown below:

Column 3, line 65, reads "…subcircuits is described herein, though it is understood by a…" and should read --…subcircuits are described herein, though it is understood by a… --.

Column 7, line 49, reads "…accordance with one aspect of the invention, connections…" and should read -- …accordance with one aspect of the invention, connection… --.

Column 15, line 35 reads "…the feedforward power amplifier 10, as discussed" and should read -- …the feedforward power amplifier 10, as discussed. --.

Column 18, line 29 reads "…ments and obvious variations thereof is contemplated as…" and should read -- …ments and obvious variations thereof are contemplated as… --.

Column 20, CLAIM 9, line 19 reads "…the lid structure having generally solid side wails extend-…" and should read -- …the lid structure having generally solid side walls extend-… --.

Signed and Sealed this

Nineteenth Day of December, 2006

JON W. DUDAS
*Director of the United States Patent and Trademark Office*